(12) United States Patent
Fujita et al.

(10) Patent No.: US 11,177,316 B2
(45) Date of Patent: Nov. 16, 2021

(54) METHOD OF MANUFACTURING LIGHT EMITTING DEVICE, LIGHT EMITTING DEVICE, AND PROJECTOR

(71) Applicant: Seiko Epson Corporation, Tokyo (JP)

(72) Inventors: Tetsuji Fujita, Chino (JP); Yasutaka Imai, Suwa (JP); Koichiro Akasaka, Ina (JP); Hideki Hahiro, Yamagata (JP); Michifumi Nagawa, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/801,485

(22) Filed: Feb. 26, 2020

(65) Prior Publication Data

US 2020/0273908 A1  Aug. 27, 2020

(30) Foreign Application Priority Data

Feb. 27, 2019  (JP) .............................. JP2019-033830

(51) Int. Cl.
*H01L 27/15*  (2006.01)

(52) U.S. Cl.
CPC .................................. *H01L 27/156* (2013.01)

(58) Field of Classification Search
CPC ...... H01L 27/156; H01L 33/007; H01L 33/08
See application file for complete search history.

(56) References Cited

U.S. PATENT DOCUMENTS

| 2011/0062453 A1 | 3/2011 | Armitage |
| 2011/0169025 A1 | 7/2011 | Kishino et al. |
| 2014/0246647 A1* | 9/2014 | Cha .......................... H01L 33/18 257/9 |

FOREIGN PATENT DOCUMENTS

| JP | 2009-140976 A | 6/2009 |
| JP | 2009-283876 A | 12/2009 |
| JP | 2013-148677 A | 8/2013 |
| JP | 2013-239718 A | 11/2013 |
| JP | 2014-154673 A | 8/2014 |

* cited by examiner

*Primary Examiner* — Changhyun Yi
(74) *Attorney, Agent, or Firm* — Harness, Dickey & Pierce, P.L.C.

(57) ABSTRACT

A method of manufacturing a light source device includes the steps of providing a mask layer to a substrate, providing the mask layer with a plurality of first openings and at least one second opening, and growing columnar parts having a light emitting section from the plurality of first openings, and growing a structure from the second opening.

12 Claims, 16 Drawing Sheets

METHOD OF MANUFACTURING LIGHT EMITTING DEVICE, LIGHT EMITTING DEVICE, AND PROJECTOR

The present application is based on, and claims priority from JP Application Serial Number 2019-033830, filed Feb. 27, 2019, the disclosure of which is hereby incorporated by reference herein in its entirety.

BACKGROUND

1. Technical Field

The present disclosure relates to a method of manufacturing a light emitting device, a light emitting device, and a projector.

2. Related Art

In recent years, development of a small-sized projector provided with a plurality of nano-columns as a light source is in progress. Such a small-sized projector can be provided with a light source high in efficiency, high in luminance, and long in life compared to a related-art LED (Light Emitting Diode), and attracts attention as an eco-friendly energy-saving projector.

For example, in JP-A-2013-239718 (Document 1), there is described the fact that nano-columns are grown from the semiconductor substrate toward an area above a mask pattern via a plurality of openings using an MOCVD (Metal Organic Chemical Vapor Deposition) method, an MBE (Molecular Beam Epitaxy) method, or the like.

In such a light emitting device as described in Document 1, when growing the nano-columns, a raw material of the nano-columns attached on the mask pattern migrates on the mask pattern to gather at each of the openings to form the nano-columns. However, when an amount of the raw material migrating on the mask pattern is large, the excessive raw material of the nano-columns makes the nano-columns huge in some cases. Thus, the nano-columns adjacent to each other have contact with each other to incur a significant decrease in light emission efficiency and maximum light output in some cases. Furthermore, the light with a desired wavelength fails to be emitted in some cases.

SUMMARY

A method of manufacturing a light emitting device according to an aspect of the present disclosure includes providing a mask layer to a substrate, providing the mask layer with a plurality of first openings and at least one second opening, and growing columnar parts having a light emitting section from the plurality of first openings, and growing a structure from the second opening.

In the method of manufacturing a light emitting device according to the above aspect, in the providing the mask layer with the first openings and the second opening, the second opening may be provided with an annular shape, and the plurality of first openings may be formed inside the second opening when viewed from a thickness direction of the substrate.

In the method of manufacturing a light emitting device according to the above aspect, in the providing the mask layer with the first openings and the second opening, the mask layer may be provided with a first portion and a second portion located outside the first portion when viewed from the thickness direction of the substrate, the plurality of first openings and the second opening may be formed in the first portion, and the second portion may be planarized.

In the method of manufacturing a light emitting device according to the above aspect, in the providing the mask layer with the first openings and the second opening, a plurality of the second openings may be formed, when viewed from a thickness direction of the substrate, the plurality of second openings may be formed so as to surround the plurality of first openings, the second openings may be formed to have the same shapes as shapes of the first openings, and the second openings may be formed to have the same sizes as sizes of the first openings.

In the method of manufacturing a light emitting device according to the above aspect, in the providing the mask layer with the first openings and the second opening, the mask layer may be provided with a first portion and a second portion located outside the first portion when viewed from the thickness direction of the substrate, the plurality of first openings and the plurality of second openings surrounding the plurality of first openings when viewed from the thickness direction of the substrate may be formed in the first portion, and the second portion may be planarized.

A light emitting device according to an aspect of the present disclosure includes a substrate, a plurality of columnar parts provided to the substrate, and at least one structure provided to the substrate, and having the same layer structure as a layer structure of the columnar parts, wherein the columnar parts have a light emitting section, an electrical current is injected into the columnar parts, and no electrical current is injected into the structure.

In the light emitting device according to the above aspect, a shape of the structure may be an annular shape when viewed from a thickness direction of the substrate, and the plurality of columnar parts may be disposed inside the structure.

The light emitting device according to the above aspect may further include a cladding layer provided to the substrate, wherein the cladding layer may be provided with a plurality of first openings and a second opening, the columnar parts may be provided to the first openings, the structure may be provided to the second opening, and the cladding layer may include a first portion provided with the plurality of first openings and the second opening, and a second portion which is disposed outside the first portion when viewed from the thickness direction of the substrate, and is flat.

In the light emitting device according to the above aspect, a plurality of the structures may be disposed, when viewed from a thickness direction of the substrate, the plurality of structures may be disposed so as to surround the plurality of columnar parts, a shape of the structures may be the same as a shape of the columnar parts, and a size of the structures may be the same as a size of the columnar parts.

The light emitting device according to the above aspect may further include a cladding layer provided to the substrate, wherein the cladding layer may be provided with a plurality of first openings and a plurality of second openings, the columnar parts may be provided to the first openings, the structure may be provided to the second opening, and the cladding layer may include a first portion provided with the plurality of first openings and the plurality of second openings surrounding the plurality of first openings when viewed from the thickness direction of the substrate, and a second portion which is disposed outside the first portion when viewed from the thickness direction of the substrate, and is flat.

A projector according to an aspect of the present disclosure includes the light emitting device according to the above aspect.

DESCRIPTION OF EXEMPLARY EMBODIMENTS

Some preferred embodiments of the present disclosure will hereinafter be described in detail using the drawings. It should be noted that the embodiments described below do not unreasonably limit the contents of the present disclosure as set forth in the appended claims. Further, all of the constituents described hereinafter are not necessarily essential elements of the present disclosure.

1. FIRST EMBODIMENT

1.1. Light Emitting Device

Figure 1:
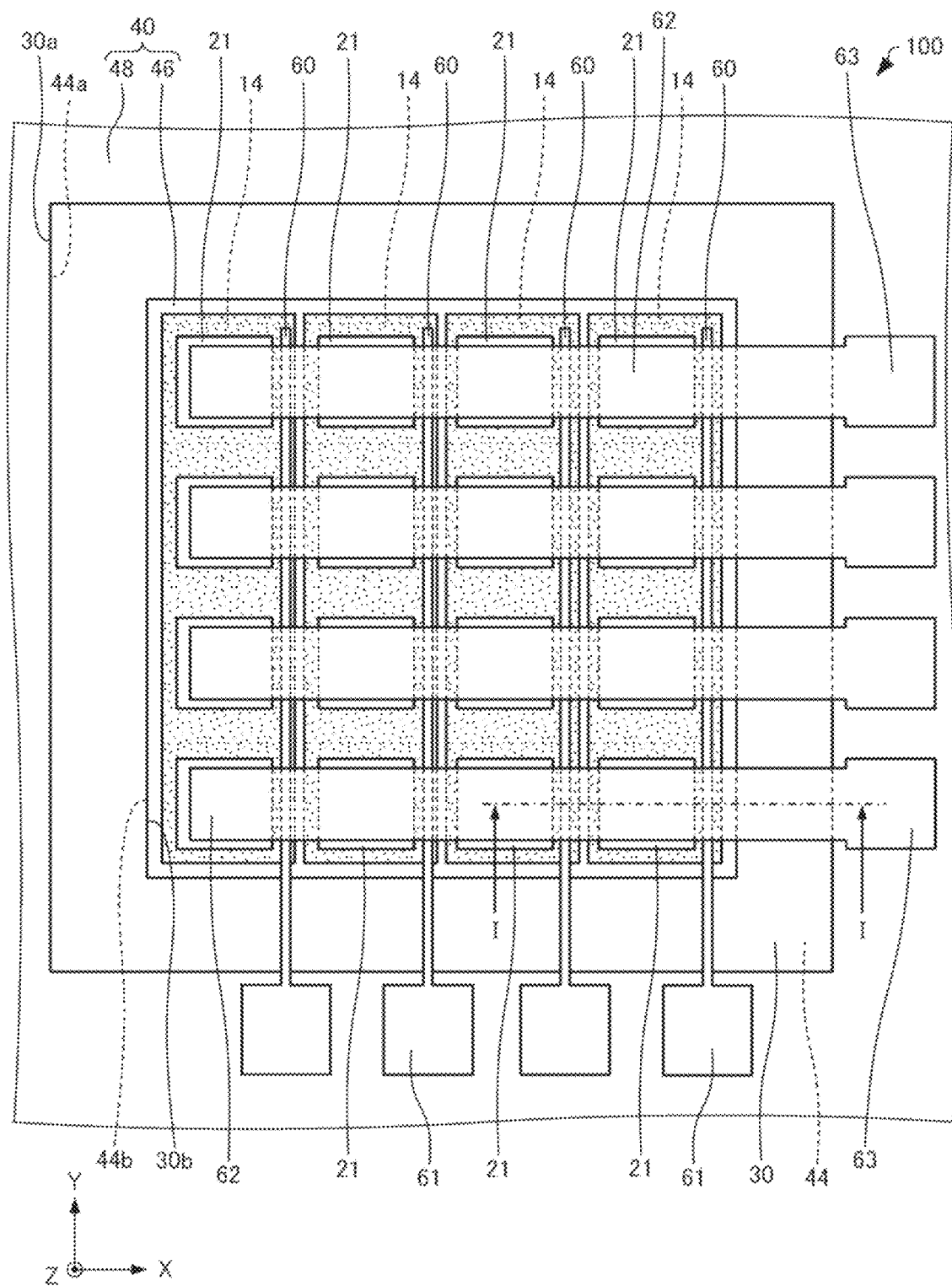
FIG. 1 is a plan view schematically showing the light emitting device according to a first embodiment.
Figure 2:
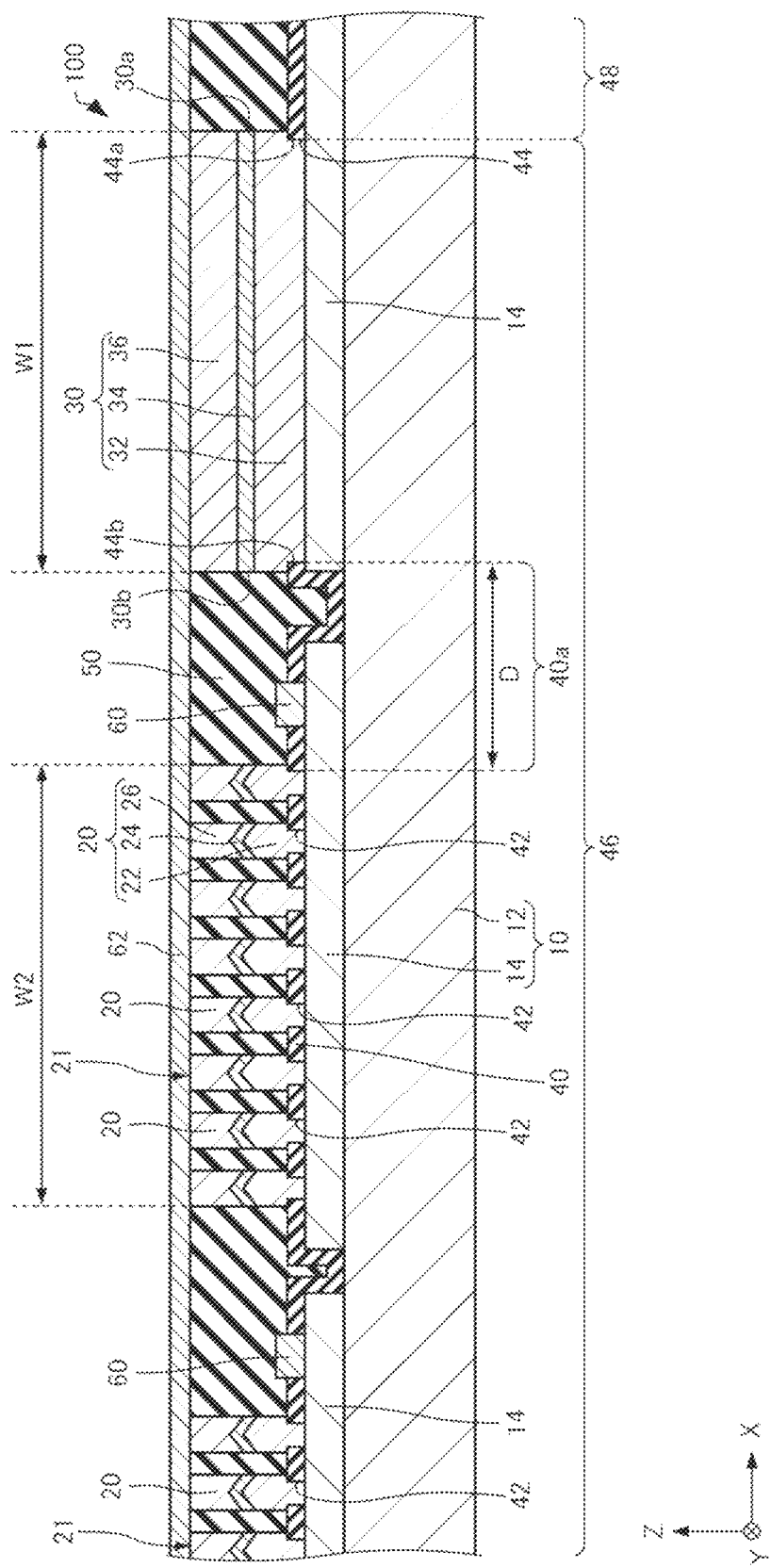
FIG. 2 is a cross-sectional view schematically showing a light emitting device according to the first embodiment.

Firstly, a light emitting device according to a first embodiment will be described with reference to the drawings. FIG. 1 is a plan view schematically showing the light emitting device 100 according to the first embodiment. FIG. 2 is a cross-sectional view along the line I-I shown in FIG. 1 schematically showing the light emitting device 100 according to the first embodiment. It should be noted that in FIG. 1 and FIG. 2, an X axis, a Y axis, and a Z axis are shown as three axes perpendicular to each other.

As shown in FIG. 1 and FIG. 2, the light emitting device 100 has, for example, a substrate 10, columnar parts 20, a structure 30, a mask layer 40, an insulating layer 50, first electrodes 60, and second electrodes 62. It should be noted that in FIG. 1, the insulating layer 50 is omitted from the illustration for the sake of convenience.

The substrate 10 has, for example, a support substrate 12 and buffer layers 14. The support substrate 12 is, for example, a GaN substrate, a sapphire substrate, or an Si substrate. The buffer layers 14 are disposed on the support substrate 12. The buffer layers 14 are each, for example, an Si-doped n-type GaN layer. In the example shown in FIG. 1, the buffer layers 14 each have a rectangular shape having a longitudinal direction in the Y-axis direction, and are arranged in the X-axis direction.

It should be noted that "upward" denotes a direction of getting away from the substrate 10 viewed from an MQW layer 24 in a stacking direction (hereinafter also referred to simply as a "stacking direction") of a first semiconductor layer 22 and the MQW layer 24 in each of the columnar parts 20, and "downward" denotes a direction of getting closer to the substrate 10 viewed from the MQW layer in the stacking direction. Further, in the following description, a direction perpendicular to the stacking direction is also referred to as an "in-plane direction of the substrate 10."

The columnar parts 20 are provided to the substrate 10. In the example shown in FIG. 2, the columnar parts 20 are disposed on the buffer layers 14. The planar shape of the columnar part 20 is a polygonal shape such as a regular hexagon, a circle, or the like. The diametrical size of the columnar part 20 is, for example, in a nanometer-order range, and is specifically no smaller than 50 nm and no larger than 500 nm. The size in the stacking direction of the columnar part 20 is, for example, no smaller than 0.5 μm and no larger than 3 μm.

It should be noted that when the planar shape of the columnar part 20 is a circle, the "diametrical size" denotes the diameter of the circle, and when the planar shape of the columnar part 20 is not a circular shape, the "diametrical size" denotes the diameter of the minimum enclosing circle. For example, when the planar shape of the columnar part 20 is a polygonal shape, the minimum enclosing circle is the minimum circle including the polygonal shape inside, and when the planar shape of the columnar shape 20 is an ellipse, the minimum enclosing circle is the minimum circle including the ellipse inside. Further, the "planar shape" denotes a shape viewed from the stacking direction. Further, when the planar shape of the columnar part 20 is a circle, the "center of the columnar part" denotes the center of the circle, and when the planar shape of the columnar part 20 is not a circular shape, the "center of the columnar part" denotes the center of the minimum enclosing circle. The same is applied to the center of the structure.

The number of the columnar parts 20 disposed is more than one. The columnar parts 20 are periodically disposed in a predetermined direction at a predetermined pitch. The pitch of the plurality of columnar parts 20 is, for example, no smaller than 0.2 μm and no larger than 1 μm. The plurality of columnar parts 20 is regularly disposed so as to form, for example, a triangular grid or a quadrangular grid when viewed from the stacking direction.

The columnar parts 20 constitute a columnar part aggregate 21. The number of the columnar parts 20 included in the columnar part aggregate 21 is, for example, several hundreds through several thousands. The number of the columnar part aggregates 21 disposed is more than one. As shown in FIG. 1, the plurality of columnar part aggregates is arranged in the X-axis direction and the Y-axis direction. In other words, the columnar aggregates 21 are arranged in a matrix. When using the light emitting device 100 in a projector, it is possible for one columnar part aggregate 21 to function as one pixel. It should be noted that in FIG. 1, the columnar part aggregates 21 are illustrated in a simplified manner for the sake of convenience.

In the illustrated example, the buffer layers 14 respectively provided with the columnar part aggregates 21 adjacent in the X-axis direction to each other are disposed at a distance from each other. The buffer layers 14 respectively provided with the columnar part aggregates 21 adjacent in the Y-axis direction to each other are connected to each other.

As shown in FIG. 2, the columnar parts 20 each have, for example, a first semiconductor layer 22, an MQW (Multi Quantum Well) layer 24, and a second semiconductor layer 26.

The first semiconductor layer 22 is disposed on the buffer layer 14. The semiconductor layer 22 is, for example, the Si-doped n-type GaN layer.

The MQW layer 24 is disposed on the first semiconductor layer 22. The MQW layer 24 is disposed between the first semiconductor layer 22 and the second semiconductor layers 26. The MQW layer 24 has a quantum well structure constituted by, for example, a GaN layer and an InGaN layer. An electrical current is injected into the MQW layer 24. The MQW layer 24 is a light emitting section capable of emitting light in response to injection of the electrical current.

The second semiconductor layer 26 is disposed on the MQW layer 24. The second semiconductor layer 26 is a layer different in conductivity type from the first semiconductor layer 22. The second semiconductor layer 26 is, for example, an Mg-doped p-type GaN layer. The first semiconductor layer 22 and the second semiconductor layer 26 are each a layer larger in bandgap than the MQW layer 24. The first semiconductor layer 22 and the second semiconductor layer 26 are cladding layers having a function of confining the light in the MQW layer 24.

In the light emitting device 100, the p-type second semiconductor layer 26, the MQW layer 24 with no impurity doped, and the n-type first semiconductor layer 22 constitute a pin diode. In the light emitting device 100, when applying a forward bias voltage of the pin diode between the first electrode 60 and the second electrode 62 to inject an electrical current, there occurs recombination of electrons and holes in the MQW layer 24. The recombination causes light emission. The light generated in the MQW layer 24 propagates through the insulating layer 50 in the in-plane direction of the substrate 10 due to the semiconductor layers 22, 26 to form a standing wave due to the effect of the photonic crystal in the plurality of columnar parts 20, and is confined in the in-plane direction of the substrate 10. The light thus confined causes laser oscillation with the gain in the MQW layer 24. Then, the light emitting device 100 emits positive first-order diffracted light and negative first-order diffracted light as a laser beam in the stacking direction.

It should be noted that the columnar part aggregates 21 adjacent to each other are disposed at a distance to the extent that the light generated in the columnar part 20 of one of the columnar part aggregates 21 fails to reach the other of the columnar part aggregates 21 through the insulating layer 50.

Further, although not shown in the drawings, it is also possible to dispose a reflecting layer between the support substrate 12 and the buffer layer 14, or below the support substrate 12. The reflecting layer is, for example, a DBR (Distributed Bragg Reflector) layer. Due to the reflecting layer, it is possible to reflect the light generated in the MQW layer 24, and thus, it is possible for the light emitting device 100 to emit the light only from the second electrode 62 side.

The structure 30 is provided to the substrate 10. The number of the structures 30 disposed is at least one. In the illustrated example, the number of the structures 30 disposed is one. The structure 30 is disposed on, for example, the buffer layers 14. The buffer layer 14 provided with the structure 30 and the buffer layer 14 provided with the columnar part 20 are separated from each other. Therefore, no electrical current is injected into the structure 30.

As shown in FIG. 1, the shape of the structure 30 is an annular shape when viewed from the thickness direction of the substrate 10. Here, the "annular shape" denotes a shape surrounding a predetermined area, and can be a shape obtained by removing a second circular shape from a first circular shape, or can also be a shape obtained by removing a second polygonal shape from a first polygonal shape such as a quadrangular shape. As shown in FIG. 1, the structure 30 has an outer edge 30a and an inner edge 30b when viewed from the thickness direction of the substrate 10. In the illustrated example, the structure 30 has a shape obtained by removing a second quadrangular shape from a first quadrangular shape. Here, the position of the center of the first quadrangular shape and the position of the center of the second quadrangular shape are the same, the shape of the first quadrangular shape and the shape of the second quadrangular shape are similar to each other, and the area of the second quadrangular shape is smaller than the area of the first quadrangular shape. When viewed from the thickness direction of the substrate 10, the plurality of columnar parts 20 is disposed inside the inner edge 30b of the structure 30. It should be noted that the thickness direction of the substrate 10 is the same as the stacking direction. Further, when viewed from the stacking direction, the shape of the structure 30 can also be, for example, a C-shape instead of the annular shape.

The structure 30 has the same layer structure as that of the columnar part 20. Specifically, the number of layers constituting the columnar part 20 and the number of layers constituting the structure 30 are the same, and the materials of the layers constituting the structure 30 are respectively the same as the materials of the layers constituting the columnar part 20. In the illustrated example, both of the columnar part 20 and the structure 30 are constituted by three layers. The structure 30 has, for example, a first semiconductor layer 32, an MQW layer 34, and a second semiconductor layer 36.

The first semiconductor layer 32 is disposed on the buffer layers 14. The first semiconductor layer 32 is grown in the same process as that of the first semiconductor layer 22 of the columnar part 20. The material of the first semiconductor layer 32 is the same as the material of the first semiconductor layer 22. The thickness of the first semiconductor layer 32 is the same as, for example, the thickness of the first semiconductor layer 22.

The MQW layer 34 is disposed on the first semiconductor layer 32. The MQW layer 34 is grown in the same process as that of the MQW layer 24 of the columnar part 20. The material of the MQW layer 34 is the same as the material of the MQW layer 24. The thickness of the MQW layer 34 is the same as, for example, the thickness of the MQW layer 24. No electrical current is injected into the MQW layer 34. Therefore, the MQW layer 34 does not emit light, and therefore, the structure 30 does not have a light emitting section.

The second semiconductor layer 36 is disposed on the MQW layer 34. The second semiconductor layer 36 is grown in the same process as that of the second semiconductor layer 26 of the columnar part 20. The material of the second semiconductor layer 36 is the same as the material of the second semiconductor layer 26. The thickness of the second semiconductor layer 36 is the same as, for example, the thickness of the second semiconductor layer 26.

The mask layer 40 is provided to the substrate 10. In the illustrated example, the mask layer 40 is disposed on the substrate 10. The mask layer 40 is a cladding layer for cladding the substrate 10. In the illustrated example, the mask layer 40 is disposed on the support substrate 12 and the buffer layers 14. The mask layer 40 is, for example, a silicon oxide layer, a silicon nitride layer, or a titanium layer. The mask layer 40 is a mask for growing the columnar parts 20 and the structure 30 on the substrate 10.

The mask layer 40 is provided with first openings 42 and a second opening 44. The first openings 42 and the second opening 44 penetrate the mask layer 40 in the stacking direction.

The first openings 42 are each an opening for growing the columnar part 20. The first openings 42 are each provided with the columnar part 20. A plurality of the first openings 42 is disposed so as to correspond to the plurality of columnar parts 20.

The second opening 44 is an opening for growing the structure 30. The second opening 44 is provided with the structure 30. The number of the second openings 44 disposed is at least one. In the illustrated example, the number of the second openings 44 disposed is one.

As shown in FIG. 1, the shape of the second opening is an annular shape when viewed from the stacking direction. The second opening 44 has an outer edge 44a and an inner edge 44b. In the illustrated example, the second opening 44 has a shape obtained by removing a fourth quadrangular shape from a third quadrangular shape. Here, the position of the center of the third quadrangular shape and the position of the center of the fourth quadrangular shape are the same, the shape of the third quadrangular shape and the shape of the fourth quadrangular shape are similar to each other, and the area of the fourth quadrangular shape is smaller than the area of the third quadrangular shape. When viewed from the stacking direction, the plurality of openings 42 is disposed inside the inner edge 44b of the second opening 44. It should be noted that when viewed from the stacking direction, the shape of the second opening 44 can also be, for example, a C-shape instead of the annular shape.

As shown in FIG. 2, the distance D between the second opening 44 and the first opening 42 the closest to the second opening 44 is, for example, no smaller than 1 µm. By making the distance D no smaller than 1 µm, it is possible to reduce slowing down of the growth of the columnar parts 20 due to a decrease in raw material migrating toward the columnar parts 20 caused by migration of the raw material attached on a part 40a of the mask layer 40 toward the second opening 44 in the process of growing the columnar parts 20 and the structure 30. Further, it is desirable for the distance D to be no larger than 1 cm. By making the distance D no larger than 1 cm, it is possible to reduce the chance for the columnar parts 20 to become huge in size due to the migration of too much raw material attached on the part 40a of the mask layer 40 toward the first openings 42. It should be noted that the part 40a is a part between the first openings 42 and the second opening 44 of the mask layer 40 when viewed from the stacking direction.

The width W1 of the second opening 44 is, for example, no smaller than 1/10 of the width W2 of the columnar part aggregate 21, and no larger than 1 cm. When the width W1 is smaller than the width W2, the raw material cannot sufficiently be trapped by the substrate 10 exposed by the second opening 44 in some cases. When the width W1 is larger than 1 cm, too much raw material is trapped, and thus, growth of the columnar parts 20 slows down in some cases.

The mask layer 40 has a first portion 46 and a second portion 48. The first portion 46 is provided with the plurality of first openings 42 and the second opening 44. In the illustrated example, the first portion 46 is a portion located inside the outer edge 44a of the second opening 44. The second portion 48 is disposed outside the first portion 46 when viewed from the stacking direction. Specifically, the second portion 48 is a portion located outside the outer edge 44a of the second opening 44 when viewed from the stacking direction. The second portion 48 is not provided with the first opening 42 and the second opening 44. An upper surface of the second portion 48 is a flat surface, and the second portion 48 is a flat portion.

As shown in FIG. 2, the insulating layer 50 is disposed on the mask layer 40. In the illustrated example, the insulating layer 50 is disposed between the columnar parts 20 adjacent to each other, between the columnar part aggregates 21 adjacent to each other, and between the columnar part aggregate 21 and the structure 30. The refractive index of the insulating layer 50 is lower than, for example, the refractive index of the MQW layer 24. The insulating layer 50 is, for example, a silicon oxide layer, an aluminum oxide layer, or a titanium oxide layer. It is possible for the insulating layer 50 to propagate the light generated in the MQW layer 24 in the in-plane direction of the substrate 10.

The first electrode 60 is disposed on the buffer layer 14. It is also possible for the buffer layer 14 to have ohmic contact with the first electrode 60. In the illustrated example, the first electrode 60 is electrically coupled to the first semiconductor layer 22 via the buffer layer 14. The first electrode 60 is one of the electrodes for injecting the electrical current into the MQW layer 24. As the first electrode 60, there is used, for example, what is obtained by stacking a Ti layer, an Al layer, and an Au layer in this order from the buffer layer 14 side.

The number of the first electrodes 60 disposed is more than one. In the illustrated example, the first electrodes 60 each have a shape extending in the Y-axis direction, and the plurality of first electrodes 60 is arranged in the X-axis direction. The first electrodes 60 are respectively coupled to first pads 61. The size in the X-axis direction of the first pad 61 is larger than the size in the X-axis direction of the first electrode 60.

The second electrode 62 is disposed on the second semiconductor layer 26. In the illustrated example, the second electrode 62 is further disposed on the second semiconductor layer 36 and the insulating layer 50. It is also possible for the second semiconductor layer 26 to have ohmic contact with the second electrode 62. The second electrode 62 is electrically coupled to the second semiconductor layer 26. The second electrode 62 is the other of the electrodes for injecting the electrical current into the MQW layer 24. As the second electrode 62, for example, ITO (Indium Tin Oxide) is used. It should be noted that although not shown in the drawings, the insulating layer is disposed between the second electrode 62 and the structure 30.

The number of the second electrodes 62 disposed is more than one. In the illustrated example, the second electrodes 62 each have a shape extending in the X-axis direction, and the plurality of second electrodes 62 is arranged in the Y-axis direction. The second electrodes 62 are respectively coupled to second pads 63. The size in the Y-axis direction of the second pad 63 is larger than the size in the Y-axis direction of the second electrode 62. The first electrodes 60 and the second electrodes 62 are configured so as to be able to inject the electrical current independently into the plurality of columnar part aggregates 21.

The light emitting device 100 has, for example, the following features.

In the light emitting device 100, there are provided the substrate 10, the plurality of columnar parts 20 provided to the substrate 10, and at least one structure 30 provided to the substrate 10 and having the same layer structure as that of the columnar part 20, the columnar parts 20 each have the light emitting section, the electrical current is injected into each of the columnar parts 20, and no electrical current is injected into the structure 30. Therefore, in the light emitting device 100, it is possible to prevent the columnar parts 20 from becoming huge in size. Thus, it is possible to prevent the columnar parts 20 adjacent to each other from having contact with each other, and thus, it is possible to improve the yield ratio. Further, in the plurality of columnar part aggregates 21, it is possible to emit light with high uniformity. Hereinafter, there will be described the reason that it is possible to prevent the columnar parts 20 from becoming huge in size.

Figure 3:
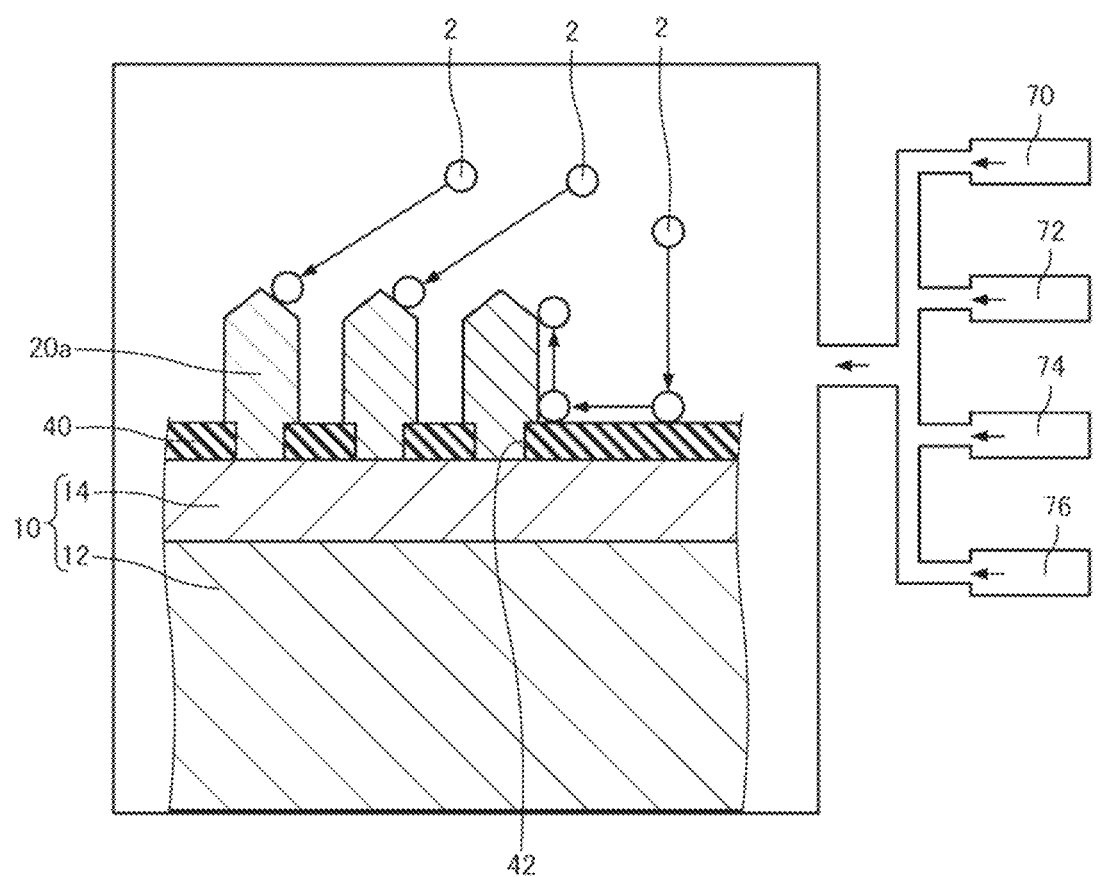
FIG. 3 is a diagram for explaining growth of columnar parts using an MOCVD method.

FIG. 3 is a diagram for explaining growth of columnar parts 20 using an MOCVD method. As shown in FIG. 3, when growing the columnar parts 20 using the MOCVD method, the raw material 2 of the columnar parts 20 includes what is directly attached to the tip of a columnar part 20a which grows to become the columnar part 20, and what is attached on the mask layer 40, then migrates on the mask layer 40 toward the columnar part 20a, and then runs up the columnar part 20a to reach the tip of the columnar part 20a. The raw material 2 attached on the mask layer 40 is significantly different in lattice constant from the mask layer 40, and therefore migrates on the mask layer 40.

If the mask layer 40 is not provided with the second opening 44 for disposing the structure 30, the amount of the raw material 2 migrating on the mask layer 40 to gather at the columnar part 20a becomes too much to make the columnar part 20 huge in size in some cases. Specifically, a large amount of the raw material 2 migrates on the second portion 48 of the mask layer 40 to gather at the columnar part 20a, and thus, the columnar part 20 becomes huge in size. The second portion 48 is a portion where an opening for trapping the raw material 2 is not disposed.

In the light emitting device 100, since the second opening 44 for disposing the structure 30 is disposed, it is possible for the substrate 10 exposed by the second opening 44 to trap the raw material 2 which migrates on, for example, the second portion 48 of the mask layer 40 toward the columnar part 20a. Further, it is possible to trap the raw material 2 by the structure grown on the substrate 10 exposed by the second opening 44. The structure grows to turn to the structure 30. Therefore, it is possible to prevent the columnar parts 20 from becoming huge in size.

It should be noted that in FIG. 3, the raw material 2 is, for example, GaN. It should be noted that the raw material 2 is not limited to GaN, and can also be a semiconductor material such as InN, AlN, InGaN, AlGaN, or InGaAlN depending on the material of the columnar parts 20.

Figure 4:
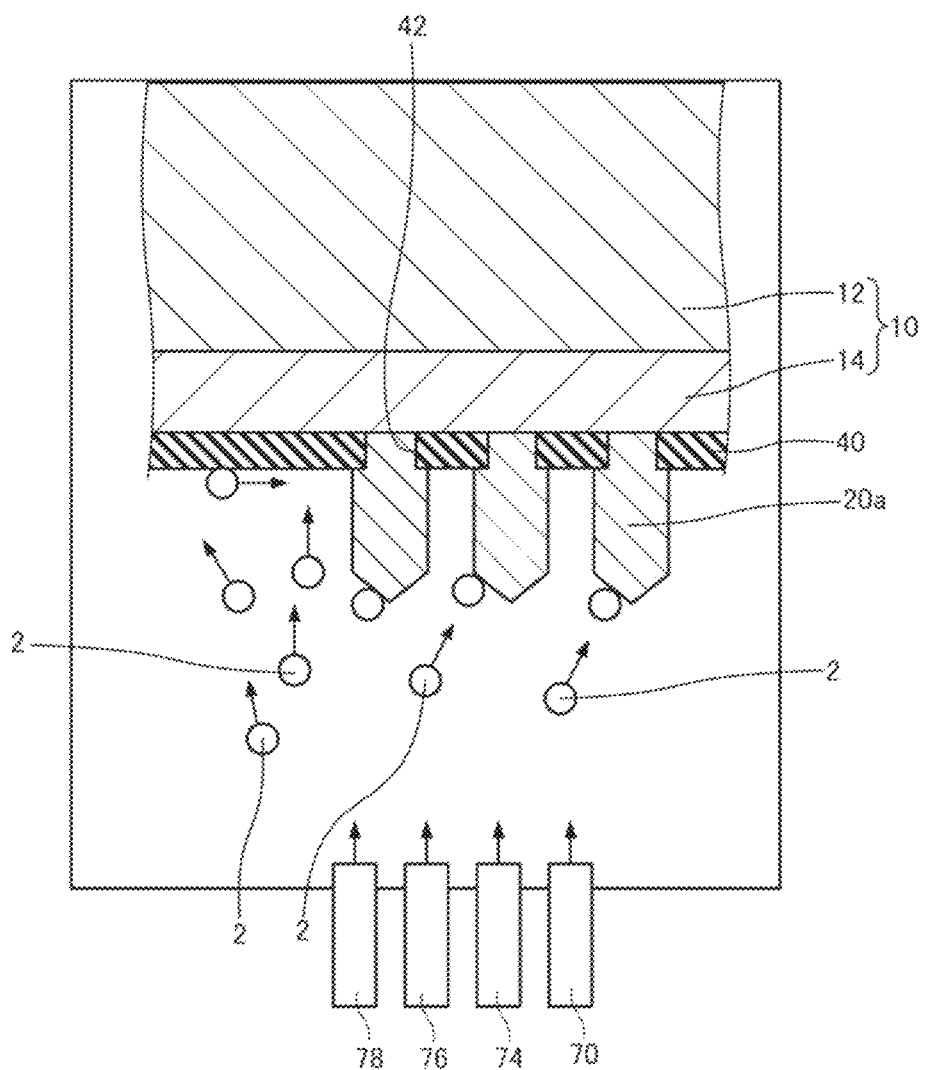
FIG. 4 is a diagram for explaining growth of the columnar parts using an MBE method.

Further, in FIG. 3, a first supply source 70 supplies $N_2$. A second supply source 72 supplies $Ga(CH_3)_3$. A third supply source 74 supplies $NH_3$. A fourth supply source 76 supplies $H_2$. In particular, in the MOCVD method, since the raw material 2 is supplied from a lateral direction of the columnar parts 20, the raw material 2 attached on the mask layer 40 is apt to migrate in the lateral direction. It should be noted that as shown in FIG. 4, even when forming the columnar parts 20 using the MBE method, the raw material 2 attached on the mask layer 40 migrates in the lateral direction. It should be noted that the lateral direction is the same as the in-plane direction of the substrate 10. Further, in FIG. 4, a fifth supply source 78 supplies Ga.

In the light emitting device 100, when viewed from the stacking direction, the shape of the structure 30 is an annular shape, and the plurality of columnar parts 20 is disposed inside the structure 30. Therefore, in the light emitting device 100, in the process of growing the columnar parts 20, it is possible to trap the raw material 2 migrating on the mask layer 40 over here from a variety of directions.

In the light emitting device 100, there is provided the mask layer 40 provided to the substrate 10, the mask layer 40 is provided with the plurality of first openings 42 and the second opening 44, the columnar parts 20 are respectively provided to the first openings 42, the structure 30 is provided to the second opening 44, and the mask layer 40 has the first portion 46 provided with the plurality of first openings 42 and the second opening 44, and the second portion 48 which is flat, and is disposed outside the first portion 46 when viewed from the stacking direction. In the light emitting device 100, in the process of growing the columnar parts 20, it is possible to trap the raw material 2 migrating on the second portion 48 of the mask layer 40 toward the columnar part 20a.

It should be noted that although the MQW layer 24 of the InGaN type is described above, any types of material capable of emitting light in response to an electrical current injected in accordance with the wavelength of the light to be emitted can be used as the MQW layer 24. It is possible to use semiconductor materials such as an AlGaN type, an AlGaAs type, an InGaAs type, an InGaAsP type, an InP type, a GaP type, or an AlGaP type.

Further, although the example in which the buffer layers 14 are exposed by the second opening 44 is described above, the material of the layer to be exposed by the second opening 44 is not limited providing the layer to be exposed can trap the raw material 2. For example, by controlling the material of the layer to be exposed by the second opening 44, it is possible to control the amount of the raw material 2 to be trapped. It should be noted that the manufacturing method can further be simplified in the example in which the buffer layers 14 are exposed by the second opening 44.

Further, although when the light emitting device 100 is the laser device is described above, it is also possible for the light emitting device 100 to be an LED.

1.2. Method of Manufacturing Light Emitting Device

Figure 5:
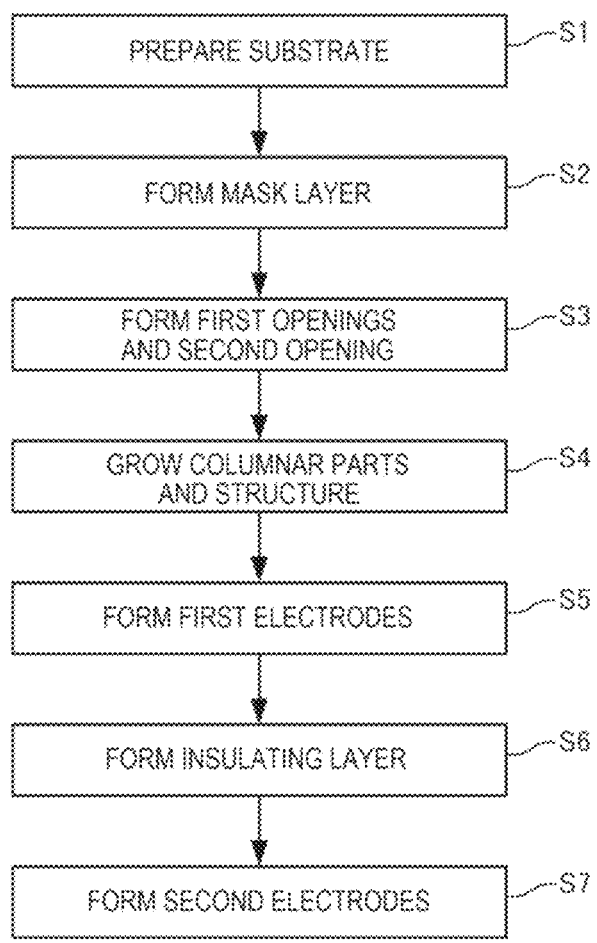
FIG. 5 is a flowchart for explaining a method of manufacturing the light emitting device according to the first embodiment.
Figure 6:
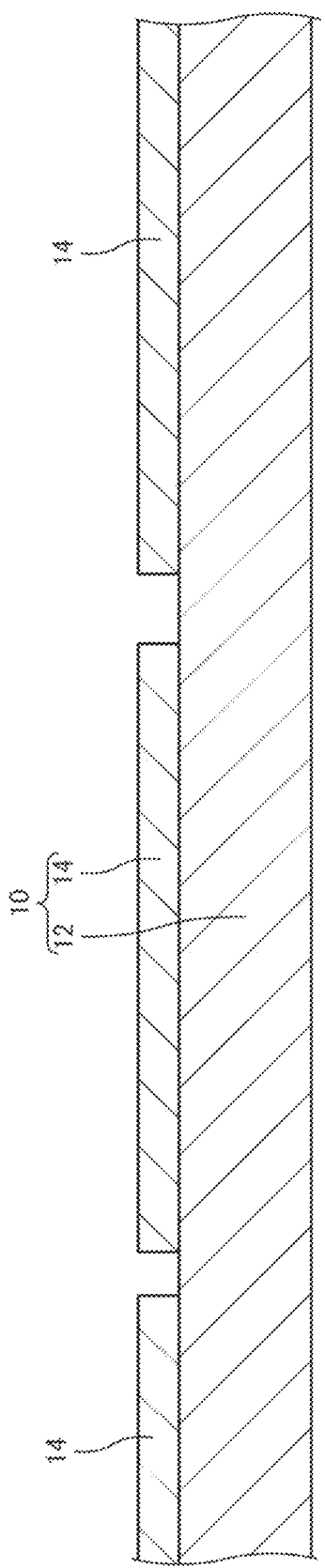
FIG. 6 is a cross-sectional view schematically showing a manufacturing process of the light emitting device according to the first embodiment.
Figure 7:
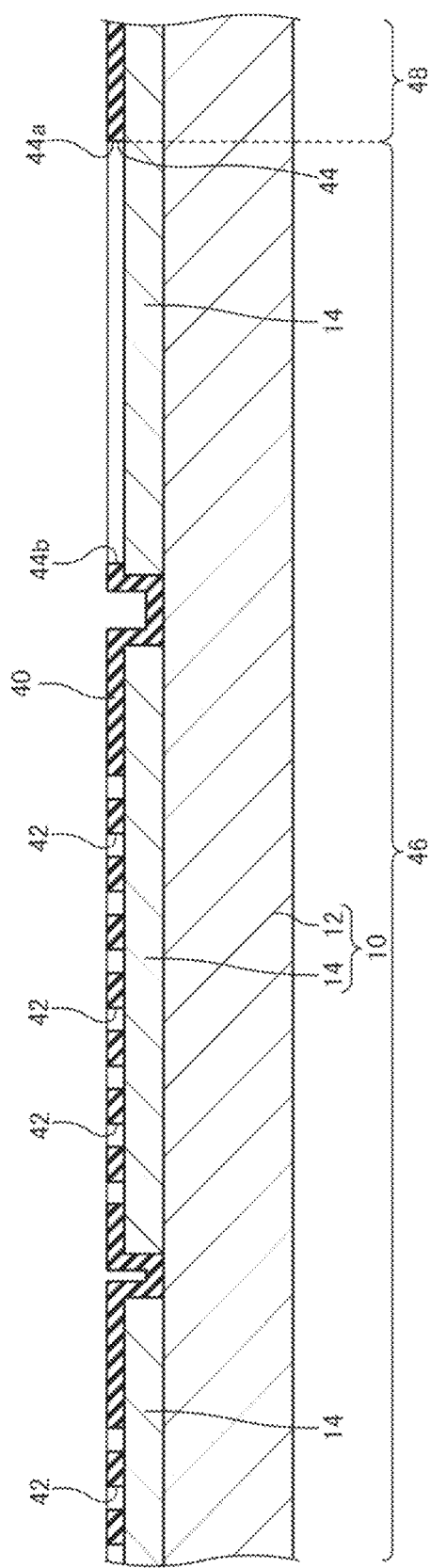
FIG. 7 is a cross-sectional view schematically showing a manufacturing process of the light emitting device according to the first embodiment.
Figure 8:
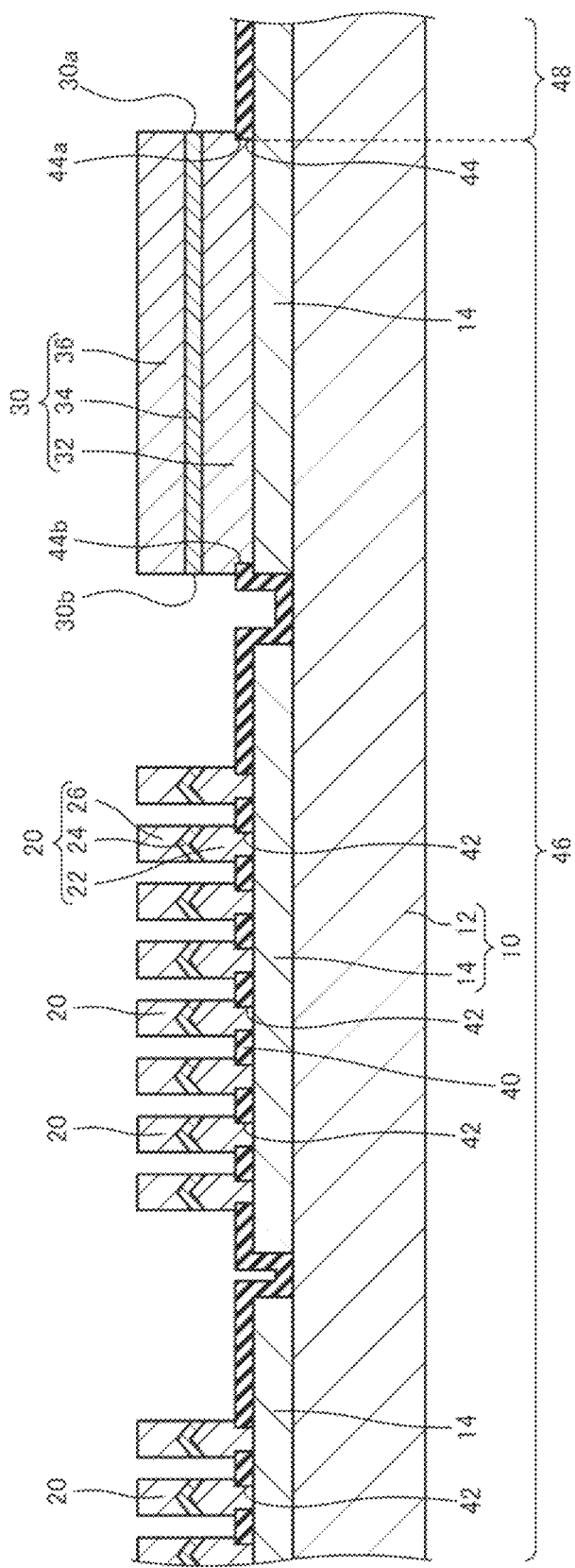
FIG. 8 is a cross-sectional view schematically showing a manufacturing process of the light emitting device according to the first embodiment.

Then, a method of manufacturing the light emitting device 100 according to the first embodiment will be described with reference to the drawings. FIG. 5 is a flowchart for explaining the method of manufacturing the light emitting device 100 according to the first embodiment. FIG. 6 through FIG. 8 are cross-sectional views schematically showing the method of manufacturing the light emitting device 100 according to the first embodiment.

As shown in FIG. 6, the substrate 10 is prepared (step S1). Specifically, the support substrate 12 is prepared, and then the buffer layers 14 are epitaxially grown on the support substrate 12. As the method of growing the layers epitaxially, there can be cited, for example, the MOCVD method and the MBE method. Then, the buffer layers 14 are patterned using, for example, photolithography and etching. According to the above, the substrate 10 can be prepared.

As shown in FIG. 7, the mask layer 40 is formed (step S2) on the substrate 10. Specifically, the mask layer 40 is formed on the substrate 10 using a sputtering method, the MOCVD method, the MBE method, or the like.

Then, the plurality of first openings 42 and the second opening 44 are provided (step S3) to the mask layer 40. Specifically, the mask layer 40 is patterned using, for example, the photolithography and the etching to form the plurality of first openings 42 and the second opening 44 in the mask layer 40.

In the process (step S3) of forming the first openings 42 and the second opening 44, an annular shape is provided to the second opening 44, and then the plurality of first openings 42 is formed inside the second opening 44 when viewed from the stacking direction. Further, the mask layer 40 is provided with the first portion 46 and the second portion 48 located outside the first portion 46 when viewed from the stacking direction to form the plurality of first openings 42 and the second opening 44 in the first portion 46, and the second portion 48 is planarized.

As shown in FIG. 8, the columnar parts 20 are grown from the plurality of first openings 42, and the structure 30 is grown from the second opening 44 (step S4). Specifically, the first semiconductor layer 22, the MQW layer 24, and the second semiconductor layer 26 are grown epitaxally in this order on the buffer layers 14 using the mask layer 40 as a mask to form the columnar parts 20. Further, the first semiconductor layer 32, the MQW layer 34, and the second semiconductor layer 36 are grown epitaxally in this order on the buffer layers 14 using the mask layer 40 as a mask to form the structure 30. As the method of growing the layers epitaxially, there can be cited, for example, the MOCVD method and the MBE method.

In the process (step S4) of growing the columnar parts 20 and the structure 30, the first semiconductor layers 22, 23 are grown in the same process. Further, the MQW layers 24, 34 are grown in the same process. The second semiconductor layers 26, 36 are grown in the same process. Thus, the structure 30 has the same layer structure as that of the columnar part 20.

As shown in FIG. 2, some of the buffer layers 14 are then exposed, and then the first electrodes 60 are formed on the buffer layers 14 thus exposed. The first electrodes 60 are formed (step S5) using, for example, a vacuum deposition method.

Then, the insulating layer 50 is formed on the mask layer 40 and the first electrodes 60. The insulating layer 50 is formed (step S6) using, for example, a spin-coating method.

Subsequently, the second electrodes 62 are formed on the columnar parts 20, the structure 30, and the insulating layer 50. The second electrodes 62 are formed (step S7) using, for example, a vacuum deposition method.

According to the process described hereinabove, the light emitting device 100 can be manufactured.

The method of manufacturing the light emitting device 100 has, for example, the following features.

In the method of manufacturing the light emitting device 100, there are provided the process of providing the mask layer 40 to the substrate 10, the process of forming the plurality of first openings 42 and at least one second opening 44 in the mask layer 40, and the process of growing the columnar parts 20 each having the light emitting section from the plurality of first openings 42 and growing the structure 30 from the second opening 44. Therefore, in the method of manufacturing the light emitting device 100, it is possible to trap the raw material 2 migrating on the mask layer 40 toward the columnar parts 20 with the substrate 10 exposed by the second opening 44 and the structure grown on the substrate 10 thus exposed as described above. Thus, it is possible to prevent the columnar parts 20 from becoming huge in size.

In the method of manufacturing the light emitting device 100, the annular shape is provided to the second opening 44, and then the plurality of first openings 42 is formed inside the second opening 44 when viewed from the stacking direction in the process of forming the first openings 42 and the second opening 44. Therefore, it is possible to trap the raw material 2 migrating on the mask layer 40 over here from a variety of directions.

In the method of manufacturing the light emitting device 100, the mask layer 40 is provided with the first portion 46 and the second portion 48 located outside the first portion 46 when viewed from the stacking direction to form the plurality of first openings 42 and the second opening 44 in the first portion 46, and the second portion is planarized in the process of forming the first openings 42 and the second opening 44. In the method of manufacturing the light emitting device 100, it is possible to trap the raw material 2 migrating on the second portion 48 of the mask layer 40 toward the columnar parts 20.

1.3. Modified Examples of Light Emitting Device 1.3.1. First Modified Example

Figure 9:
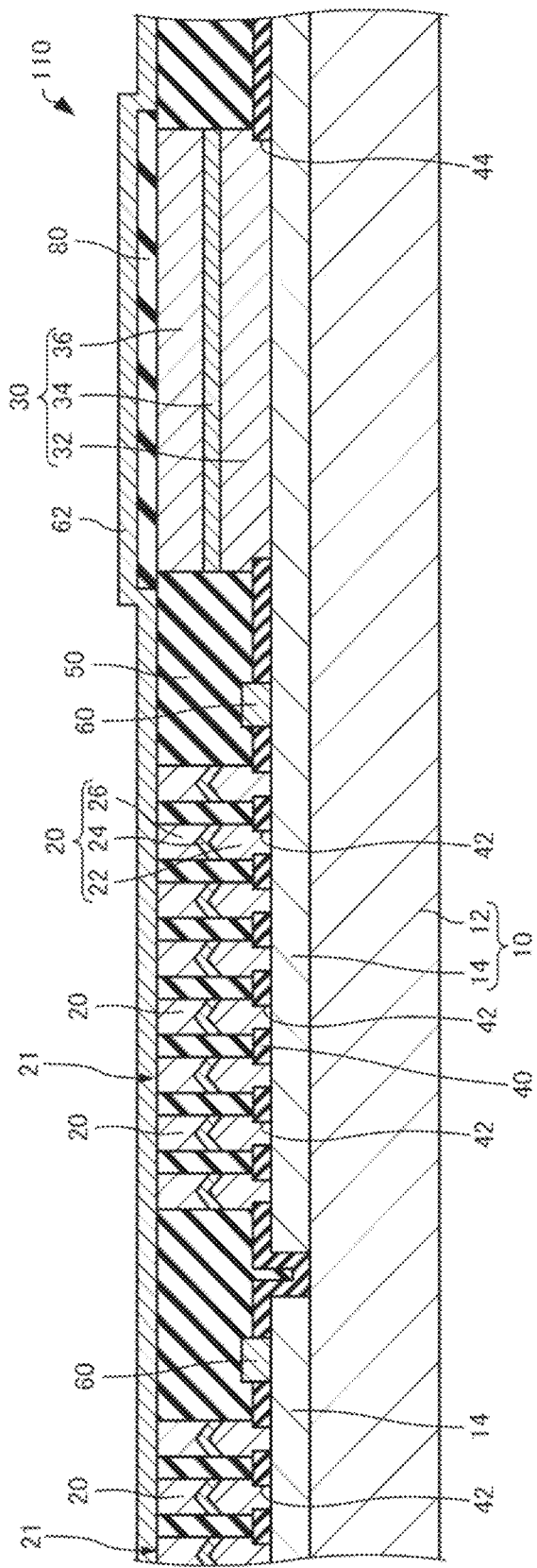
FIG. 9 is a cross-sectional view schematically showing a light emitting device according to a first modified example of the first embodiment.

Then, a light emitting device 110 according to a first modified example of the first embodiment will be described with reference to the drawings. FIG. 9 is a cross-sectional view schematically showing the light emitting device 110 according to the first modified example of the first embodiment.

Hereinafter, in the light emitting device 110 according to the first modified example of the first embodiment, the points in which the light emitting device 110 is different from the light emitting device 100 according to the first embodiment described above will be described, and the description of the points in which the light emitting devices are substantially the same will be omitted. The same applies to a light emitting device according to a second modified example described later of the first embodiment.

As shown in FIG. 2, in the light emitting device 100 described above, the buffer layer 14 provided with the structure 30 and the buffer layer 14 provided with the columnar part aggregate 21 the closest to the structure 30 are separated from each other.

In contrast, as shown in FIG. 9, in the light emitting device 110, the buffer layer 14 provided with the structure 30 and the buffer layer 14 provided with the columnar part aggregate 21 the closest to the structure 30 are coupled to each other to be integrally disposed.

In the light emitting device 110, for example, an insulating layer 80 is disposed between the second electrodes 62 and the structure 30. Thus, no electrical current is injected into the structure 30 by the first electrodes 60 and the second electrodes 62. The insulating layer 80 is, for example, a silicon oxide layer or a silicon nitride layer.

It should be noted that although not shown in the drawings, providing the electrical current can be made to flow through the second electrode 62 disposed on the columnar part 20, it is not required to dispose the insulating layer 80 and the second electrodes 62 on the structure 30.

1.3.2. Second Modified Example

Figure 10:
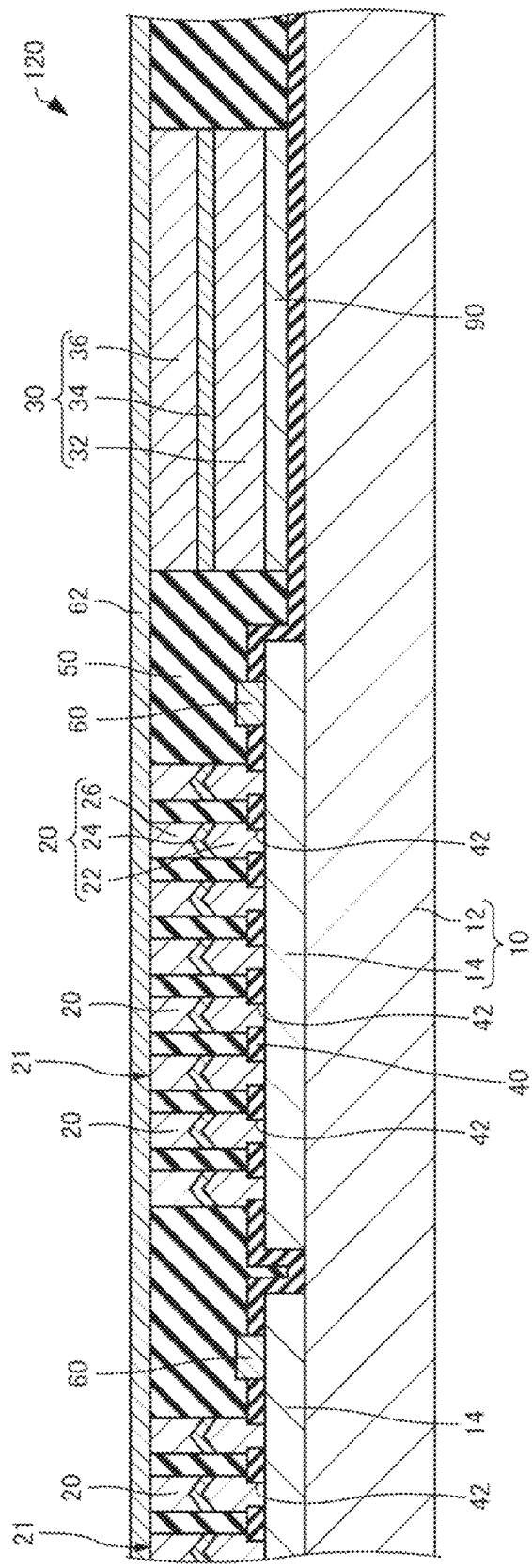
FIG. 10 is a cross-sectional view schematically showing a light emitting device according to a second modified example of the first embodiment.

Then, a light emitting device 120 according to a second modified example of the first embodiment will be described with reference to the drawings. FIG. 10 is a cross-sectional view schematically showing the light emitting device 120 according to the second modified example of the first embodiment.

In the light emitting device 100 described above, as shown in FIG. 2, the mask layer 40 is provided with the second opening 44.

In contrast, in the light emitting device 120, as shown in FIG. 10, the mask layer 40 is not provided with the second opening 44.

In the light emitting device 120, a trap layer 90 is disposed on the mask layer 40. The trap layer 90 is a layer for trapping the raw material 2 in the process of growing the columnar parts 20. The material of the trap layer 90 is the same as, for example, the material of the buffer layers 14. It should be noted that the material of the trap layer 90 is not particularly limited providing the trap layer 90 can trap the raw material 2. For example, by controlling the material of the trap layer 90, it is possible to control the amount of the raw material 2 to be trapped. The structure 30 is disposed on the trap layer 90.

2. SECOND EMBODIMENT 2.1. Light Emitting Device

Figure 11:
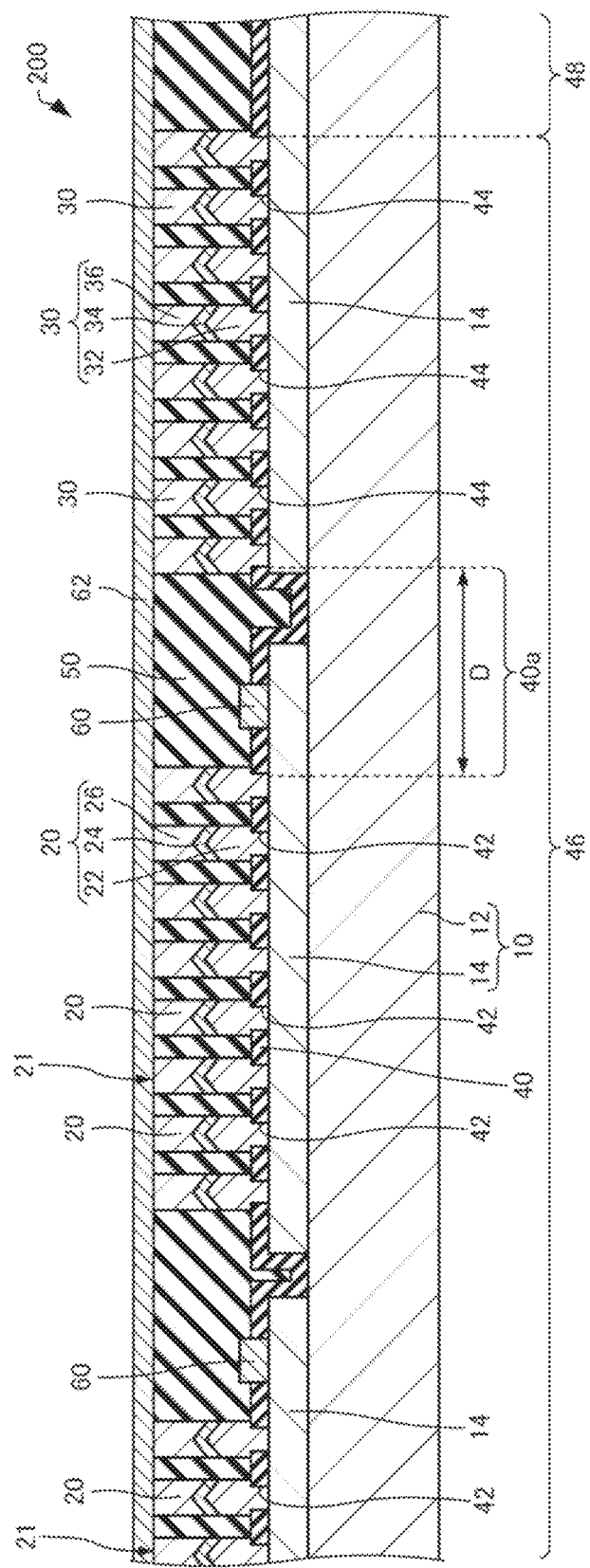
FIG. 11 is a cross-sectional view schematically showing a light emitting device according to a second embodiment.

Then, a light emitting device 200 according to a second embodiment will be described with reference to the drawings. FIG. 11 is a cross-sectional view schematically showing the light emitting device 200 according to the second embodiment. Hereinafter, in the light emitting device 200 according to the second embodiment, the points in which the light emitting device 200 is different from the light emitting device 100 according to the first embodiment described above will be described, and the description of the points in which the light emitting devices are substantially the same will be omitted.

In the light emitting device 100 described above, as shown in FIG. 1 and FIG. 2, the number of the structures 30 disposed is one, and the number of the second openings 44 disposed is one.

In contrast, in the light emitting device 200, as shown in FIG. 11, there is disposed a plurality of the structures 30, and there is disposed a plurality of the second openings 44.

The shape of the structure 30 is the same columnar shape as that of the columnar part 20. The shape of the structure 30 is the same as the shape of the columnar part 20 when viewed from the stacking direction. The size of the structure 30 is the same as the size of the columnar part 20 when viewed from the stacking direction. The distance between the structures 30 adjacent to each other is the same as, for example, the distance between the columnar parts 20 adjacent to each other. The plurality of structures 30 is disposed so as to surround the plurality of columnar parts 20 when viewed from the stacking direction. The plurality of structures 30 is regularly arranged similarly to the plurality of columnar parts 20 when viewed from the stacking direction. The distance between the structures 30 adjacent to each other denotes the distance between the centers of the respective structures 30 adjacent to each other, and the distance between the columnar parts 20 adjacent to each other denotes the distance between the centers of the respective columnar parts 20 adjacent to each other.

In the first portion 46 of the mask layer 40, there are disposed the plurality of first openings 42, and the plurality of second openings 44 surrounding the plurality of first openings 42 when viewed from the stacking direction. The first portion 46 is a portion located inside the figure formed by connecting the second openings 44 located on the outermost circumference out of the plurality of second openings 44 disposed so as to surround the plurality of first openings 42 when viewed from the stacking direction.

The light emitting device 200 has, for example, the following features.

In the light emitting device 200, there is disposed the plurality of structures 30, the plurality of structures 30 is disposed so as to surround the plurality of columnar parts 20, the shape of the structure 30 is the same as the shape of the columnar part 20, and the size of the structure 30 is the same as the size of the columnar part 20. Thus, in the light emitting device 200, it is possible to prevent the structures grown on the substrate exposed by, for example, the second openings 44 from excessively trapping the raw material 2 in the process of growing the columnar parts 20 compared to the case of the light emitting device 100. When the raw material 2 is excessively trapped, the columnar parts 20 cannot sufficiently grow in some cases. As described above, in the light emitting device 200, it is possible to control the amount of the raw material 2 which migrates on the mask layer 40 to reach the columnar part 20a.

The shortest distance D between the second openings 44 and the first openings 42 is, for example, equal to or longer than the distance between the first openings 42 adjacent to each other. By making the distance D equal to or longer than the distance between the first openings adjacent to each other, it is possible to reduce the chance for the columnar parts 20 and the structures 30 to have contact with each other. Further, it is desirable for the distance D between the second opening 44 and the first opening 42 the closest to the second opening 44 to be no smaller than 1 µm. By making the distance D no smaller than 1 µm, it is possible to reduce the delay of the growth of the columnar parts 20 due to a decrease in raw material migrating toward the columnar parts 20 caused by migration of the raw material attached on a part 40a of the mask layer 40 toward the second openings 44 in the process of growing the columnar parts 20 and the structures 30. Further, it is desirable for the distance D to be no larger than 1 cm. By making the distance D no larger than 1 cm, it is possible to reduce the chance for the columnar parts 20 to become huge in size due to the migration of too much raw material attached on the part 40a of the mask layer 40 toward the first openings 42. It should be noted that the part 40a is a part between the first openings 42 and the second openings of the mask layer 40 when viewed from the stacking direction.

It should be noted that when viewed from the stacking direction, the shape of the plurality of second openings 44 is not particularly limited, but can also be a shape of a line.

2.2. Method of Manufacturing Light Emitting Device

Then, a method of manufacturing the light emitting device 200 according to the second embodiment will be described with reference to the drawings. Hereinafter, in the method of manufacturing the light emitting device 200 according to the second embodiment, the points in which the method of manufacturing the light emitting device 200 is different from the method of manufacturing the light emitting device 100 according to the first embodiment described above will be described, and the description of the points in which the methods are substantially the same will be omitted.

As shown in FIG. 11, in the method of manufacturing the light emitting device 200, the plurality of second openings 44 is formed in the process of forming the first openings 42 and the second openings 44. Further, the plurality of second openings 44 is formed so as to surround the plurality of first openings 42 when viewed from the stacking direction. Further, the second openings 44 are formed to have the same shape as that of the first openings 42 when viewed from the stacking direction. When viewed from the stacking direction, the shape of the first openings 42 and the second openings 44 is, for example, a circular shape. Further, the second openings 44 are formed to have the same size as that of the first openings 42 when viewed from the stacking direction. Further, the plurality of first openings 42, and the plurality of second openings surrounding the plurality of first openings 42 when viewed from the stacking direction are formed in the first portion 46 of the mask layer 40, and the second portion 48 of the mask layer 40 is planarized.

The method of manufacturing the light emitting device 200 has, for example, the following features.

In the method of manufacturing the light emitting device 200, in the process of forming the first openings 42 and the second openings 44, the plurality of second openings 44 is formed, and when viewed from the stacking direction, the plurality of second openings 44 is disposed so as to surround the plurality of first openings 42, the second openings 44 are formed to have the same shape as that of the first openings 42, and the second openings 44 are formed to have the same size as that of the first openings 42. Therefore, as described above, it is possible to prevent the raw material 2 from being excessively trapped.

3. THIRD EMBODIMENT

Figure 12:
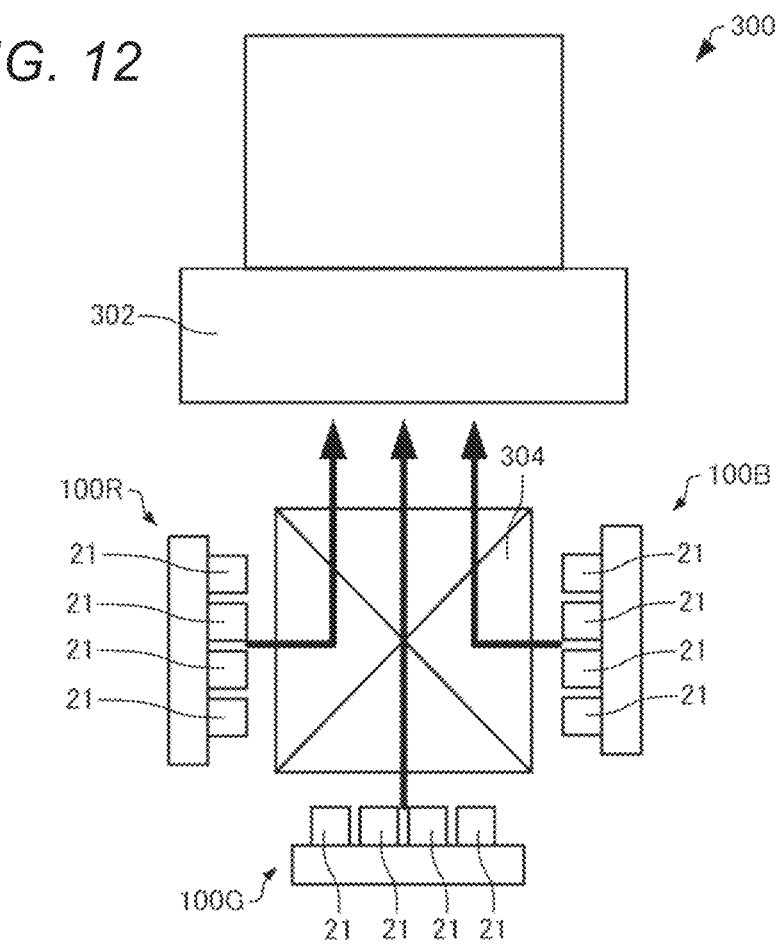
FIG. 12 is a diagram schematically showing a projector according to a third embodiment.

Then, a projector according to a third embodiment will be described with reference to the drawings. FIG. 12 is a diagram schematically showing the projector 300 according to the third embodiment.

As shown in FIG. 12, the projector 300 includes a red light source 100R, a green light source 100G, a blue light source 100B for respectively emitting red light, green light, and blue light. The red light source 100R, the green light source 100G, and the blue light source 100B are each constituted by the light emitting device 100. Further, the projector 300 has a projection lens 302. It should be noted that in FIG. 12, the red light source 100R, the green light source 100G, and the blue light source 100B are illustrated in a simplified manner for the sake of convenience.

It is possible for the red light source 100R, the green light source 100G, and the blue light source 100B to directly form an image without using a light modulation device such as a liquid crystal valve by modulating the columnar part aggregates 21 as the pixels of the image in accordance with image information. Then, the projection lens 302 projects the images formed by the red light source 100R, the green light source 100G, and the blue light source 100B on a screen not shown in an enlarged manner.

Further, the projector 300 includes, for example, a cross dichroic prism 304 for combining the light emitted from the red light source 100R, the light emitted from the green light source 100G, and the light emitted from the blue light source 100B with each other to guide the result to the projection lens 302.

The colored light emitted from the red light source 100R, the colored light emitted from the green light source 100G, and the colored light emitted from the blue light source 100B enter the cross dichroic prism 304. The cross dichroic prism 304 is formed by bonding four rectangular prisms to each other, and is provided with a dielectric multilayer film for reflecting the red light and a dielectric multilayer film for reflecting the blue light disposed on the inside surfaces so as to form a crisscross. The three colors of light are combined with each other by these dielectric multilayer films, and thus, the light representing a color image is formed. Then, the light thus combined is projected on the screen by the projection lens 302, and thus an enlarged image is displayed.

In the projector 300, the image can directly be formed by controlling the columnar part aggregates 21, and reduction in size can be achieved.

Figure 13:
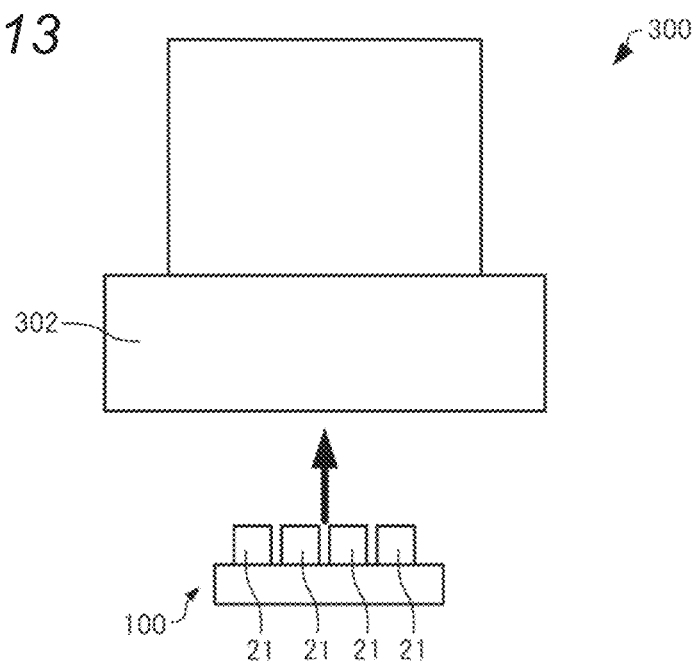
FIG. 13 is a diagram schematically showing the projector according to the third embodiment.

It should be noted that when the single light emitting device 100 can emit the red light, the green light, and the blue light by changing the size of the diameter or the pitch of the columnar parts 20 constituting the plurality of columnar part aggregates 21, the cross dichroic prism is not provided as shown in FIG. 13. In this case, the light emitted from the light emitting device 100 directly enters the projection lens 302. According to such a projector, further reduction in size can be achieved.

4. PRACTICAL EXAMPLE AND COMPARATIVE EXAMPLE

Hereinafter, a practical example and a comparative example will be shown, and the present disclosure will more specifically be described. It should be noted that the present disclosure is not at all limited by the practical example and the comparative example described below.

As Practical Example 1, a light emitting device corresponding to the light emitting device 100 described above was manufactured. The buffer layers, the columnar parts, and the structure were grown using the MOCVD method. It should be noted that in Practical Example 1, members corresponding to the insulating layer 50, the first electrodes 60, the first pads 61, the second electrodes 62, and the second pads 63 are not formed.

Comparative Example 1 is substantially the same as Practical Example 1 except the point that the second opening is not provided to the mask layer, and the structure is not provided.

Figure 14:
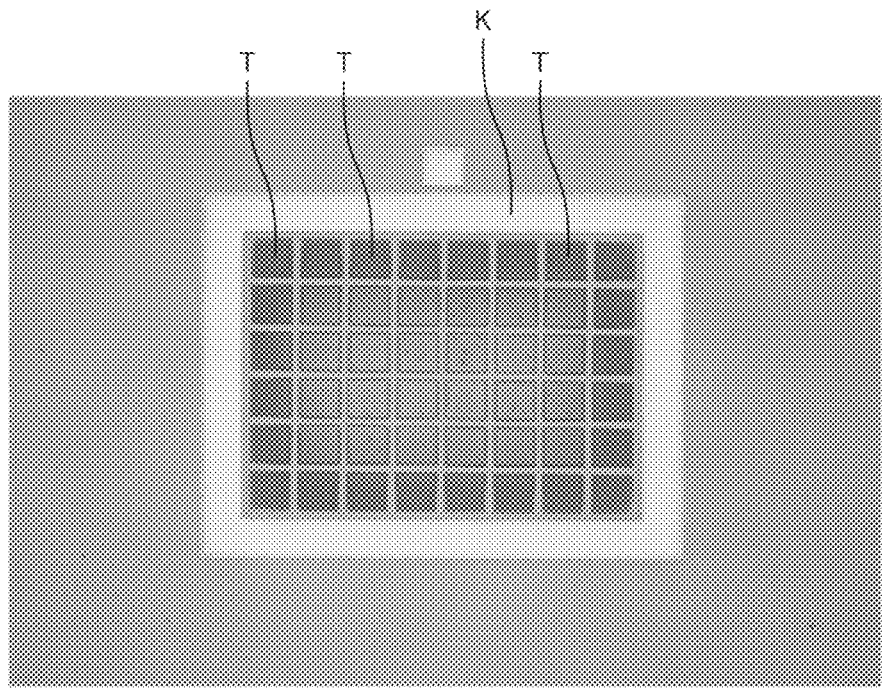
FIG. 14 is a diagram showing a metallographic image in Practical Example 1.
Figure 15:
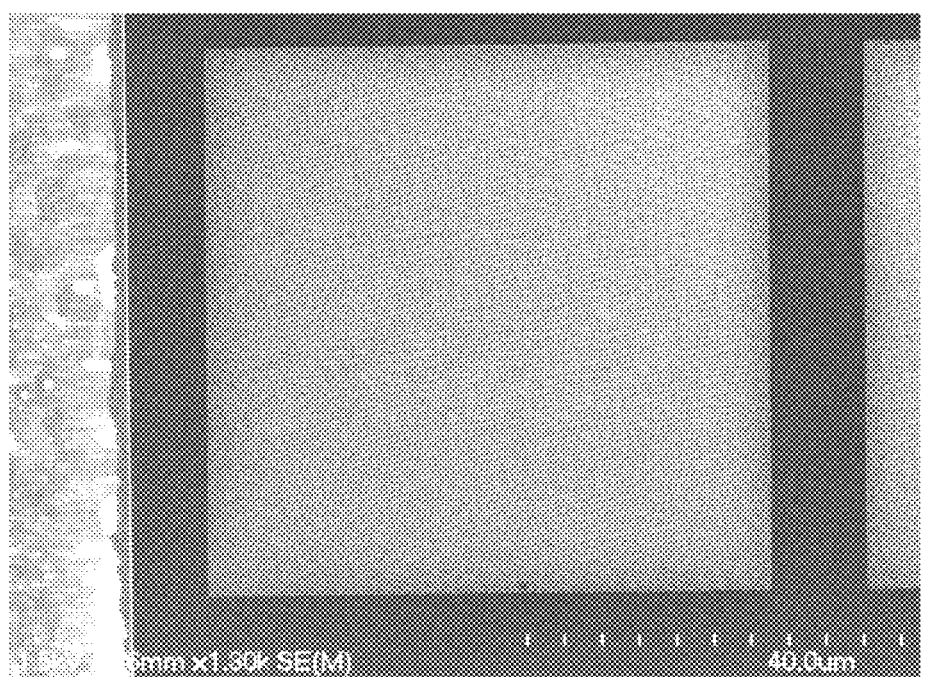
FIG. 15 is a diagram showing an SEM image in Practical Example 1.
Figure 16:
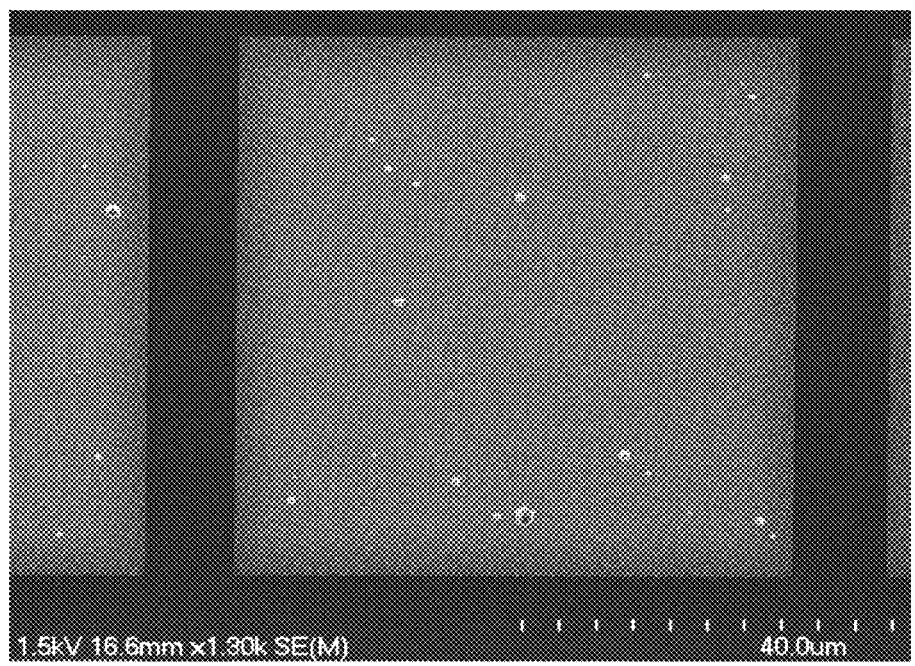
FIG. 16 is a diagram showing an SEM image in Practical Example 1.
Figure 17:
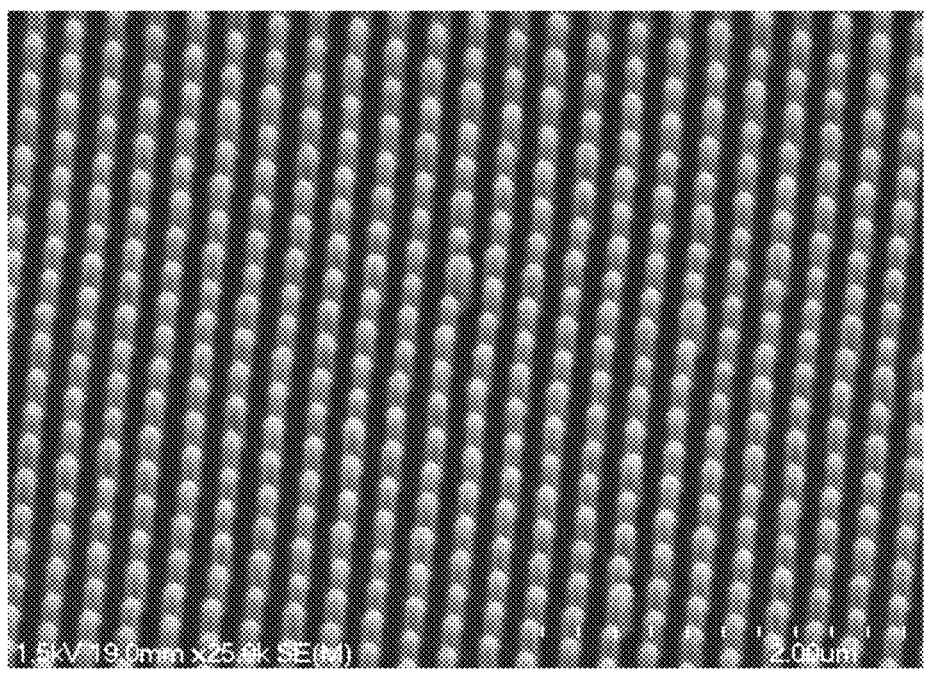
FIG. 17 is a diagram showing an SEM image in Practical Example 1.
Figure 18:
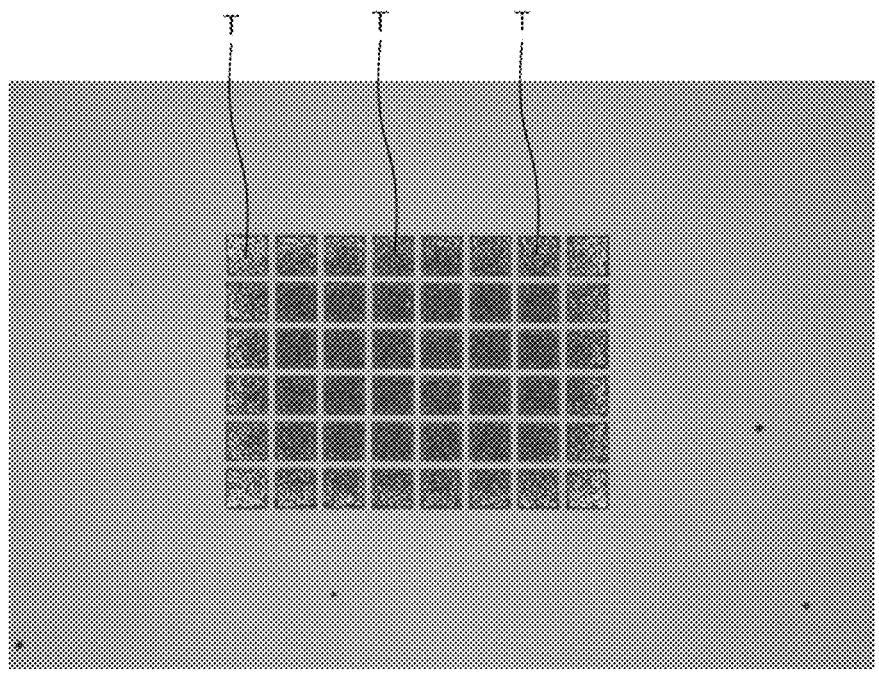
FIG. 18 is a diagram showing a metallographic image in Comparative Example 1.
Figure 19:
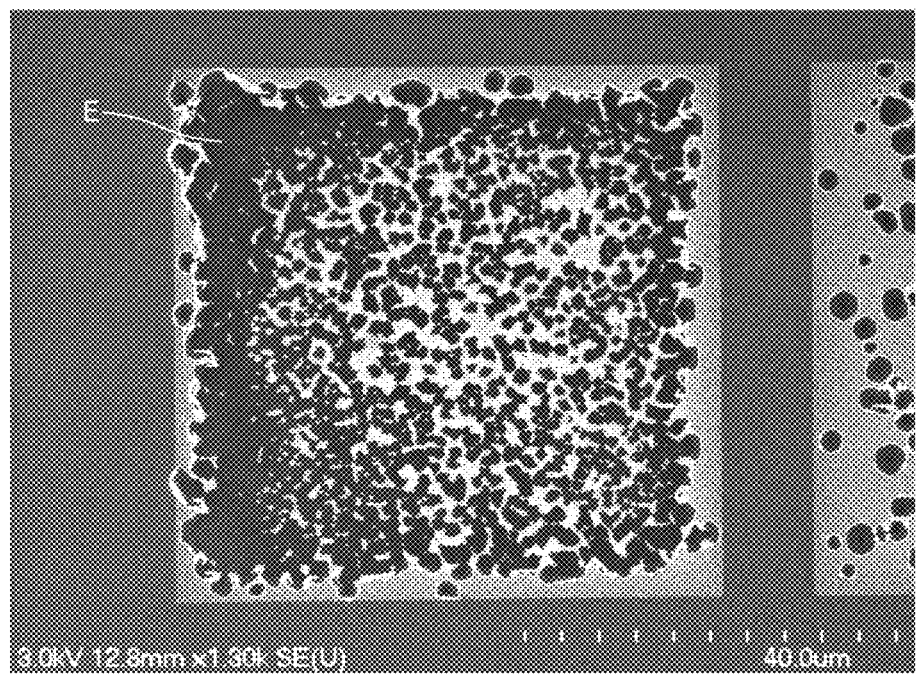
FIG. 19 is a diagram showing an SEM image in Comparative Example 1.
Figure 20:
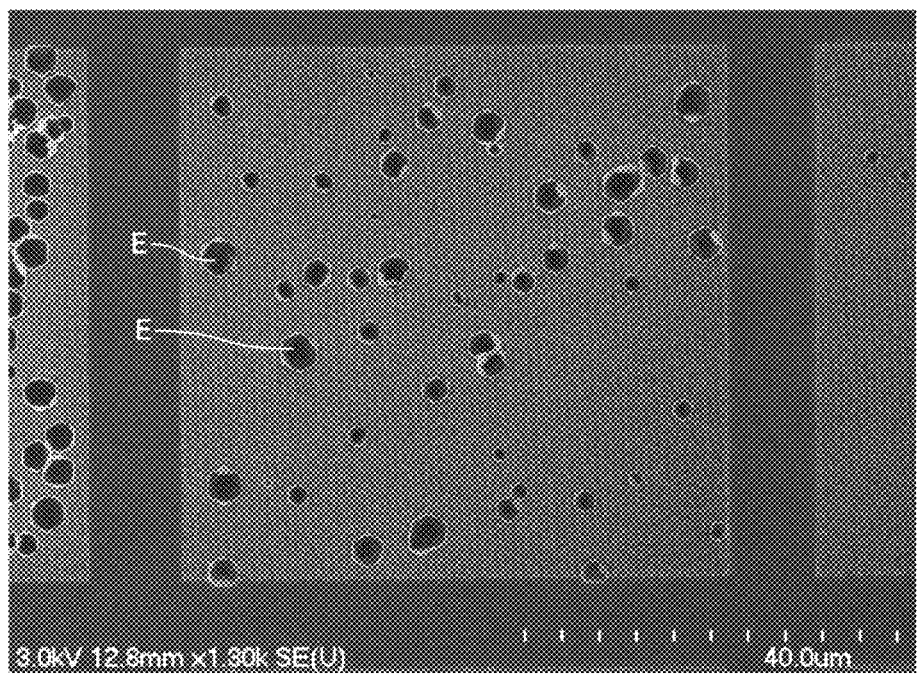
FIG. 20 is a diagram showing an SEM image in Comparative Example 1.
Figure 21:
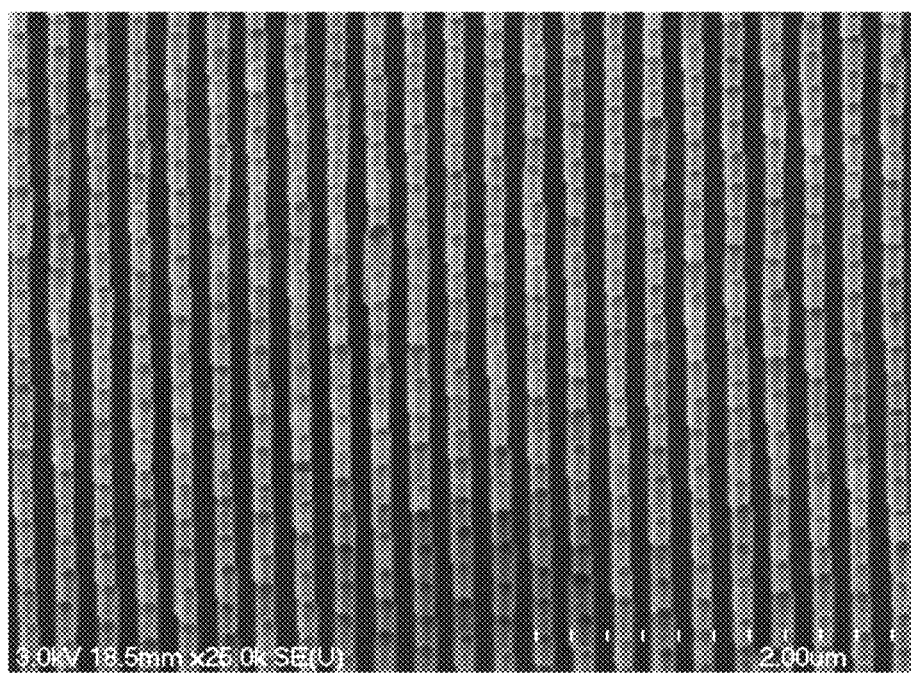
FIG. 21 is a diagram showing an SEM image in Comparative Example 1.

FIG. 14 shows a metallographic image in Practical Example 1. FIG. 15 through FIG. 17 each show an SEM (Scanning Electron Microscope) image in Practical Example 1. FIG. 18 shows a metallographic image in Comparative Example 1. FIG. 19 through FIG. 21 each show an SEM image in Comparative Example 1.

It should be noted that in FIG. 14 and FIG. 18, "T" denotes the columnar part aggregate. Further, in FIG. 14, "K" denotes the structure. Further, FIG. 15 and FIG. 19 each show an image of the columnar part aggregate located on an outer circumferential part out of the columnar part aggregates arranged in a matrix. Further, FIG. 16 and FIG. 20 each show an image of the columnar part aggregate located in a central part out of the columnar part aggregates arranged in a matrix. Further, FIG. 17 and FIG. 21 each show an image of the columnar part aggregate located in the central part out of the columnar part aggregates arranged in a matrix when observed from obliquely above.

As shown in FIG. 18 and FIG. 19, in Comparative Example 1, there was observed the fact that the columnar parts became huge in size, and thus, a plurality of columnar parts had contact with each other. In contrast, as shown in FIG. 15 and FIG. 16, in Practical Example 1, the contact between the plurality of columnar parts was not observed. This is because, in Practical Example 1, the substrate exposed by the second opening and the structure trapped the raw material migrating on the mask layer, and therefore, the columnar parts were prevented from becoming huge in size. It should be noted that in FIG. 19 and FIG. 20, "E" denotes the columnar part having contact with each other.

By comparing FIG. 19 and FIG. 20 with each other, the contact between the plurality of columnar parts was more conspicuously observed in the columnar part aggregates located on the peripheral part than in the columnar part aggregates located in the central part out of the plurality of columnar part aggregates. This is because, when viewed from the stacking direction, the plurality of columnar part aggregates was surrounded by the mask layer, and thus, more excessive raw material was supplied to the peripheral part.

As shown in FIG. 16 and FIG. 20, in Practical Example 1, it was possible to prevent the contact between the plurality of columnar parts compared to Comparative Example 1 also in the central part out of the plurality of columnar part aggregates. As shown in FIG. 15 through FIG. 16, it was found out that in Practical Example 1, it was possible to prevent the contact between the plurality of columnar parts in both of the central part and the peripheral part out of the plurality of columnar part aggregates, and thus, it was possible to decrease the difference in growth condition of the columnar part between the central part and the peripheral part.

It should be noted that according to FIG. 21, it was found out that even in Comparative Example 1, the columnar parts grew without becoming huge in size in some portions.

The present disclosure can be implemented with some of the constituents omitted, or combining any of the embodiments and the modified examples with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration denotes a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages or configurations capable of achieving the same object as that of the configurations explained in the description of the embodiments. Further, the present disclosure includes configurations obtained by adding a known technology to the configuration explained in the description of the embodiments.

What is claimed is:

1. A method of manufacturing a light emitting device, comprising:
   providing a mask layer to a substrate;
   providing the mask layer with a plurality of first openings and at least one second opening; and
   growing columnar parts having a light emitting section from the plurality of first openings, and growing a structure from the second opening, wherein
   in the providing the mask layer with the first openings and the second opening,
   the second opening is provided with an annular shape, and the plurality of first openings is formed inside the second opening when viewed from a thickness direction of the substrate.

2. The method of manufacturing the light emitting device according 1, wherein
   in the providing the mask layer with the first openings and the second opening,
   the mask layer is provided with a first portion and a second portion located outside the first portion when viewed from the thickness direction of the substrate,
   the plurality of first openings and the second opening are formed in the first portion, and
   the second portion is planarized.

3. The method of manufacturing the light emitting device according to claim 1, wherein
   in the providing the mask layer with the first openings and the second opening,
   a plurality of the second openings is formed,
   when viewed from a thickness direction of the substrate,
   the plurality of second openings is formed so as to surround the plurality of first openings,
   the second openings are formed to have same shapes as shapes of the first openings, and
   the second openings are formed to have same sizes as sizes of the first openings.

4. The method of manufacturing the light emitting device according to claim 3, wherein
   in the providing the mask layer with the first openings and the second opening,
   the mask layer is provided with a first portion and a second portion located outside the first portion when viewed from the thickness direction of the substrate,
   the plurality of first openings and the plurality of second openings surrounding the plurality of first openings when viewed from the thickness direction of the substrate are formed in the first portion, and
   the second portion is planarized.

5. A light emitting device comprising:
   a substrate;
   a plurality of columnar parts provided to the substrate; and
   at least one structure provided to the substrate, and having a same layer structure as a layer structure of the columnar parts, wherein
   the columnar parts have a light emitting section,
   an electrical current is injected into the columnar parts, and
   no electrical current is injected into the structure.

6. The light emitting device according to claim 5, wherein
   a shape of the structure is an annular shape when viewed from a thickness direction of the substrate, and
   the plurality of columnar parts is disposed inside the structure.

7. The light emitting device according to claim 6, further comprising:
   a cladding layer provided to the substrate, wherein
   the cladding layer is provided with a plurality of first openings and a second opening,
   the columnar parts are provided to the first openings,
   the structure is provided to the second opening, and
   the cladding layer includes a first portion provided with the plurality of first openings and the second opening, and a second portion which is disposed outside the first portion when viewed from the thickness direction of the substrate, and is flat.

8. The light emitting device according to claim 5, wherein a plurality of the structures is disposed, when viewed from a thickness direction of the substrate, the plurality of structures is disposed so as to surround the plurality of columnar parts, a shape of the structures is same as a shape of the columnar parts, and a size of the structures is same as a size of the columnar parts.

9. The light emitting device according to claim 8, further comprising:

a cladding layer provided to the substrate, wherein the cladding layer is provided with a plurality of first openings and a plurality of second openings, the columnar parts are provided to the first openings, the structures are provided to the second openings, and the cladding layer includes a first portion provided with the plurality of first openings and the plurality of second openings surrounding the plurality of first openings when viewed from the thickness direction of the substrate, and a second portion which is disposed outside the first portion when viewed from the thickness direction of the substrate, and is flat.

10. A projector comprising:

the light emitting device according to claim 5.

11. The light emitting device according to claim 5, wherein the at least one structure provided to the substrate further comprises a plurality of the structures provided to the substrate, and each one of the structures has a columnar shape.

12. The light emitting device according to claim 11, wherein when viewed from a thickness direction of the substrate, adjacent ones of the structures are separated from each other by the same distance that adjacent ones of the columnar parts are separated from each other.

\* \* \* \* \*